United States Patent [19]

Nakatani et al.

[11] Patent Number: 5,012,158

[45] Date of Patent: Apr. 30, 1991

[54] PLASMA CVD APPARATUS

[75] Inventors: Isao Nakatani; Takao Furubayashi, both of Funabashi, Japan

[73] Assignee: National Research Institute for Metals, Tokyo, Japan

[21] Appl. No.: 451,766

[22] Filed: Dec. 18, 1989

Related U.S. Application Data

[63] Continuation-in-part of Ser. No. 77,673, Jul. 23, 1987, abandoned.

[30] Foreign Application Priority Data

| Jul. 25, 1986 | [JP] | Japan | 61-173833 |
| Jul. 25, 1986 | [JP] | Japan | 61-173834 |
| Dec. 20, 1988 | [JP] | Japan | 63-319429 |

[51] Int. Cl.$^5$ .............................................. H01J 7/24
[52] U.S. Cl. .......................... 315/111.21; 315/111.51; 315/112; 313/231.31
[58] Field of Search .............. 315/111.21, 111.51, 315/111.71, 111.91, 112; 313/231.30, 30, 32, 35

[56] References Cited

U.S. PATENT DOCUMENTS

| 3,296,410 | 1/1967 | Hedger | 315/111.51 X |
| 3,340,415 | 9/1967 | De Ruiter et al. | 315/111.51 X |
| 3,903,891 | 9/1975 | Brayshaw | 313/231.31 X |
| 4,423,303 | 12/1983 | Hirose et al. | 315/111.21 X |
| 4,482,246 | 11/1984 | Meyer et al. | 313/231.31 X |
| 4,645,977 | 2/1987 | Kurokawa et al. | 315/111.21 |
| 4,828,369 | 5/1989 | Hotomi | 315/111.21 X |
| 4,859,908 | 8/1989 | Yoshida et al. | 315/111.21 X |
| 4,910,044 | 3/1990 | Yamazaki et al. | 315/111.21 X |

*Primary Examiner*—Eugene R. LaRoche
*Assistant Examiner*—Do Hyun Yoo
*Attorney, Agent, or Firm*—Wenderoth, Lind & Ponack

[57] ABSTRACT

A plasma CVD apparatus having a rotary vacuum reaction vessel, a starting gas introducing port, an ambient gas introducing port, an exhaust port, electrodes or an induction coil for applying a high-frequency electric field, and a cooling pipe provided in the starting gas introducing port for cooling the starting gas introducing port, wherein the starting gas introducing port and the exhaust port are located in opposition to each other on a rotating axis of the reaction vessel.

19 Claims, 2 Drawing Sheets

PLASMA CVD APPARATUS

BACKGROUND OF THE INVENTION

1. Cross Reference

This application is a continuation-in-part application of co-pending U.S. Ser. No. 07/077,673 filed on July 23, 1983, now abandoned on Dec. 27, 1989.

2. Field of the Invention

This invention relates to a plasma CVD apparatus and particularly, to a low-temperature plasma CVD apparatus which can generate a plasma discharge having excellent stability over an extended period of time. This apparatus is used, for example, for the production of fine particles of metals, alloys and ceramics such as metal oxides and metal nitrides, magnetic fluids composed of fine particles of ferromagnetic metals, alloys, metal oxides or metal nitrides, and colloids containing fine particles of metals, alloys and ceramics.

3. Description of the Prior Art

In conventional plasma CVD apparatuses disclosed, for example, in A. K. Shinha, H. J. Levinstein, T. E. Smith, G. Quitana and S. E. Haszko: J. Electrochem. Soc., 125 (1978), 610, and F. D. Egitto: J. Electrochem. Soc., 127 (1980), 1354, a starting gas blowing port is provided at or near an electrode on the high voltage side, and therefore rises in temperature owing to bombardment of electrons and some ions in a plasma accelerated by an electric field. For example, when one attempts to obtain Fe-N fine particles or an Fe-N magnetic fluid by using $Fe(CO)_5$ and $N_2$ gas, fine particles of a mixture of Fe, Fe—N and $Fe_3N$ are always obtained in whatever manner the partial pressure of $N_2$ gas is controlled. Furthermore, the gas blowing port may be blocked by masses of precipitated Fe, and it is difficult to operate the apparatus continuously for more than 30 minutes. The present Inventors have diligently worked so as to find out a cause of these troubles, and have now discovered that under a reduced pressure of several mmHg in a plasma vapor-phase reaction, $Fe(CO)_5$ readily decomposes thermally at above 100° C. as shown by the following reaction

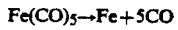

and this reaction occurs in the inside of the gas blowing port by the mechanism described hereinabove.

Accordingly, only thermally stable gases can be used as starting gases for the plasma vapor-phase reaction in the conventional plasma CVD apparatuses. If a thermally unstable starting gas is used, it undergoes a partial chemical reaction by the action of heat inside the nozzle before it is blown into the plasma. Consequently, the reaction product obtained is a mixture of a thermochemical reaction product and a plasma vapor-phase reaction product. The amount of the product yielded decreases, and the product becomes impure. Sometimes, no desired product can be obtained.

This restriction on the type of starting gases that can be used has markedly limited the application of the plasma vapor-phase reaction.

The conventional plasma CVD apparatuses include, for example, (1) a type in which opposing plate electrodes are provided in a fixed box-like plasma reaction vessel equipped with a pressure reduction exhaust opening, and a starting gas and a plasma-generating ambient gas are introduced between these electrodes; and (2) a type in which a high frequency induction coil is wrapped around the outside of a fixed plasma reaction vessel equipped with a pressure reduction exhaust opening, and a starting gas and a plasma-generating ambient gas are introduced into the plasma reaction vessel.

Since these reaction vessels are fixed, they are suitable for forming a film on a fixed substrate placed on a supporting stand provided within the reaction vessel. In the production of fine particles, however, the particles scatter within the reaction vessel and are accumulated everywhere in soot form. They are difficult to capture and the ratio of their recovery is low. Since the temperature within the vessel is non-uniform, the composition of the product accumulated differs depending upon the place of accumulation, or the particle diameter of the fine particles becomes nonuniform. Another disadvantage is that when it is desired to produce magnetic fluids or colloidal products by such an apparatus, it is necessary to provide within the reaction vessel a container for holding a liquid medium and a device for taking the fine particles into the liquid.

SUMMARY OF THE INVENTION

It is an object of this invention to provide a plasma CVD apparatus in which a thermally unstable starting gas can be used.

Another object of this invention is to provide a plasma CVD apparatus by which highly pure plasma vapor-phase reaction products such as fine particles of metals or ceramics, magnetic fluids composed of fine particles of ferromagnetic metals or ceramics, and colloids containing fine particles of metals or ceramics can be obtained at high rates of production.

Still another object of this invention is to provide a plasma CVD apparatus in which the plasma vapor-phase reaction product can be easily recovered and its composition is uniform.

Yet another object of this invention is to provide a plasma CVD apparatus in which a plasma vapor-phase reaction product having a uniform particle diameter can be obtained.

An additional object of this invention is to provide a plasma CVD apparatus having excellent operability and a high working efficiency.

According to this invention, there is provided a plasma CVD apparatus comprising a rotary vacuum reaction vessel, a starting gas introducing port means, an ambient gas introducing port means, an exhaust port means, electrodes or an induction coil for applying a high-frequency electric field, and a cooling means provided in said starting gas introducing port means for cooling said starting gas introducing port means, wherein said starting gas introducing port means and said exhaust port means are located in opposition to each other on a rotating axis of said reaction vessel.

In one embodiment, the apparatus further comprises means for rotating the reaction vessel around the axis of symmetry of the reaction vessel, and the plasma reaction vessel has an inner wall in the shape of a curved surface which is rotationally symmetrical with respect to the axis of symmetry of the reaction vessel.

DETAILED DESCRIPTION OF PREFERRED EMBODIMENTS

The invention will now be described in detail with reference to the accompanying drawings.

Figure 1:
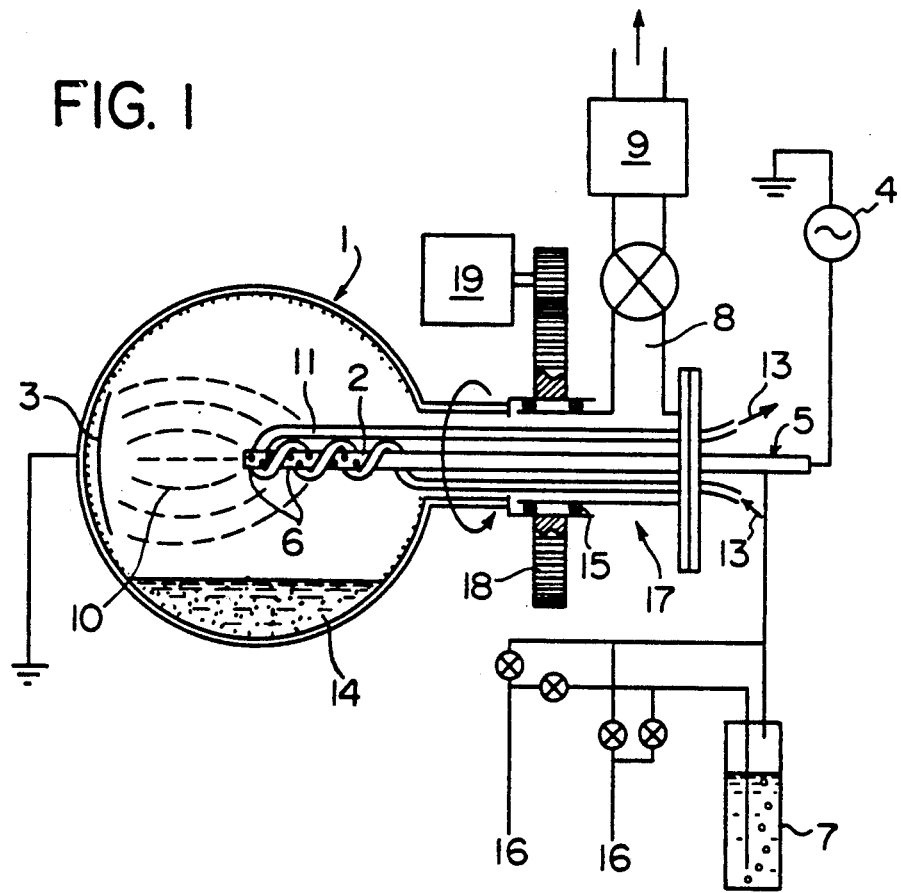
FIG. 1 is a sectional view of a capacitance-coupling plasma CVD apparatus.
Figure 2:
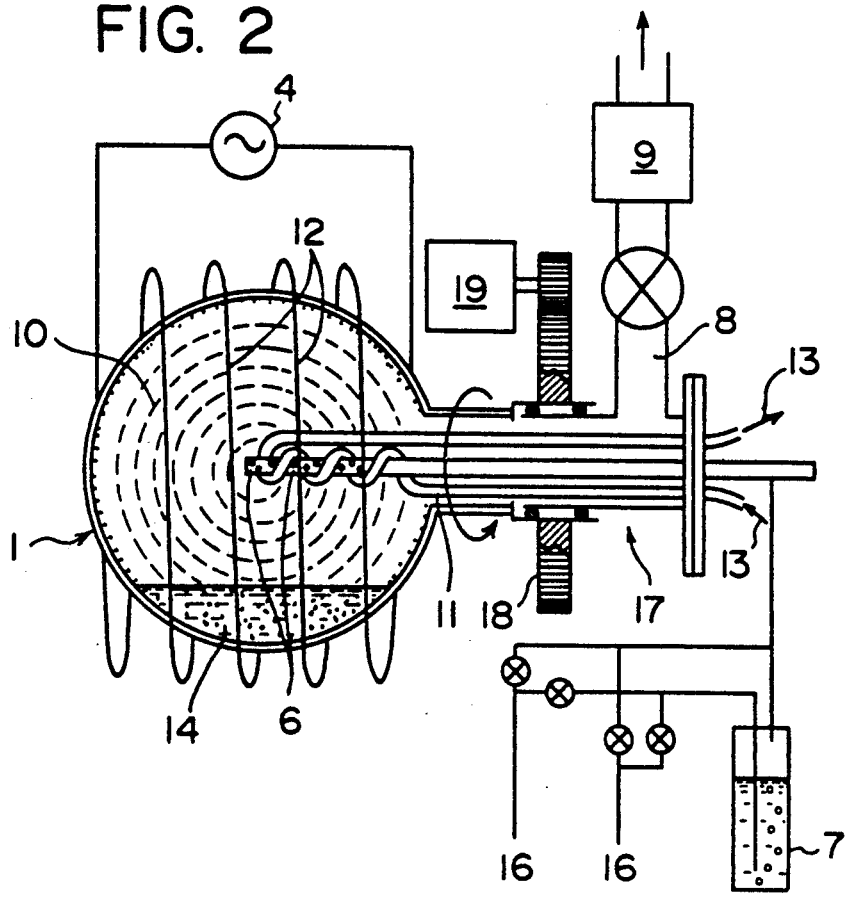
FIG. 2 is a sectional view of a reactance-coupling plasma CVD apparatus.

With reference to FIGS. 1 and 2 which show capacitance-coupling plasma CVD apparatus, an electrode 2 having a small area and an electrode 3 having a large area are provided in spaced opposed relation to each other in a plasma reaction vessel 1, and a high-frequency electric field is applied across these electrodes by means of a high-frequency generator 4. At this time, there is no restriction on the polarity. Desirably, the electrode 2 is at a higher voltage, and the electrode 3 is grounded. A starting gas 7 is introduced into the reaction vessel 1 from a starting gas blowing port means 6 via a starting gas introducing pipe 5. An ambient gas 16 may be introduced into the reaction vessel 1 together with the starting gas through the starting gas introducing pipe 5 which concurrently acts as an ambient gas introducing pipe as illustrated in FIG. 1. Desirably, to perform the plasma vapor-phase reaction efficiently, the starting gas blowing port 6 is provided on the side corresponding to the electrode 2.

When the inside of the plasma reaction vessel 1 is evacuated by a vacuum pump 9 through an exhaust opening 8 to a pressure of $10^{-3}$ to 100 mmHg, preferably 1 to 10 mmHg, a low-temperature plasma 10 is generated within the vessel 1. As a result, a strong electric field is generated near the electrodes and the starting gas blowing port means provided near the electrode is exposed to the strong electric field, and in the conventional apparatus the temperature rises due to the bombardment of electrons and ions. The starting gas undergoes a thermochemical reaction by this temperature rise before it makes contact with the plasma.

In the present invention, cooling means electrically insulated from the ground is provided at the starting gas blowing port means 6. The cooling means is comprised of, for example, a metallic helical pipe 11 having good thermal conductivity provided at the starting gas blowing port means 6. That part of the metallic pipe which is on the side of the reaction vessel is insulated, and a fluid 13 such as compressed air, cooled nitrogen gas, dried air, liquid nitrogen, an insulating oil or a Freon gas is passed through the helical pipe 11. The cooling means is not limited to this type, and may be of another type electrically insulated from the ground.

It is critical that the cooling means be electrically insulated from the ground. Otherwise, no plasma would be generated, or plasma generation would be difficult so that the plasma vapor-phase reaction could not be performed effectively.

The reactance-coupling plasma CVD apparatus shown in FIG. 2 is the same as the capacitance-coupling CVD apparatus except that in the reactance-coupling CVD apparatus, the cooling means need not necessarily to be electrically insulated from the ground.

Another feature of the present invention is that the plasma reaction vessel has an inside wall in the shape of a curved surface which is rotationally symmetrical with respect to the axis of symmetry of the vessel, and the apparatus also has means for rotating the reaction vessel around the axis of symmetry of the vessel. By dint of this structure, the resulting fine particles are accumulated in a uniform thickness on the inner wall of the reaction vessel, and the reaction temperature also becomes uniform. Thus, the composition and particle diameter of the resulting fine particles are uniform irrespective of the place of accumulation. When a liquid medium 14 is placed in the bottom portion of the reaction vessel and the plasma reaction is carried out while it is rotated around the horizontal axis, the liquid spreads in film form on the inner wall of the vessel as the vessel rotates. As a result, the resulting fine particles adhere to the liquid film and are efficiently taken into the liquid. Accordingly, this structural feature brings about the marked advantage that no special container for the liquid medium nor a device for taking the fine particles into the liquid is required in the present invention.

For convenience in recovering the reaction product, the plasma reaction vessel 1 may be detachably mounted on a base portion 17 by sealing means such as a seal ring 15.

The means for rotating the plasma reaction vessel may, for example, be a gear 18 driven by a driving motor 19 illustrated in FIG. 1. It may, however, be any other means which can rotate the reaction vessel around its axis of symmetry.

When, for example, $Fe(CO)_5$ is blown as a starting gas into the reaction vessel 1, it is decomposed by the plasma to generate Fe atoms which are associated to give fine iron particles. If at this time, a reactive gas is mixed with the ambient atmosphere, reacted fine particles are obtained. For example, if $O_2$ is mixed with the ambient gas, fine particles of iron oxide can be obtained. Fine particles of iron nitride can be obtained if $N_2$ or $NH_3$ is mixed.

To obtain fine particles of iron oxide, it is preferred to use a mixture of $O_2$ and $N_2$ so that the concentration of the $O_2$ gas is in the range of 0.1 to 50%. To obtain fine particles of iron nitride, $Fe_{2-3}N$, $Fe_4N$ and $Fe_8N$, it is preferred to use a gaseous mixture of $N_2$ and Ar with an $N_2$ concentration of 0.2 to 100%, or a gaseous mixture of $NH_3$ with $H_2$, Ar or $N_2$ with an $NH_3$ concentration of 0.1 to 100%.

The resulting fine particles of metals or ceramics can be easily collected because they adhere uniformly to the inside wall of the reaction vessel.

Figure 3:
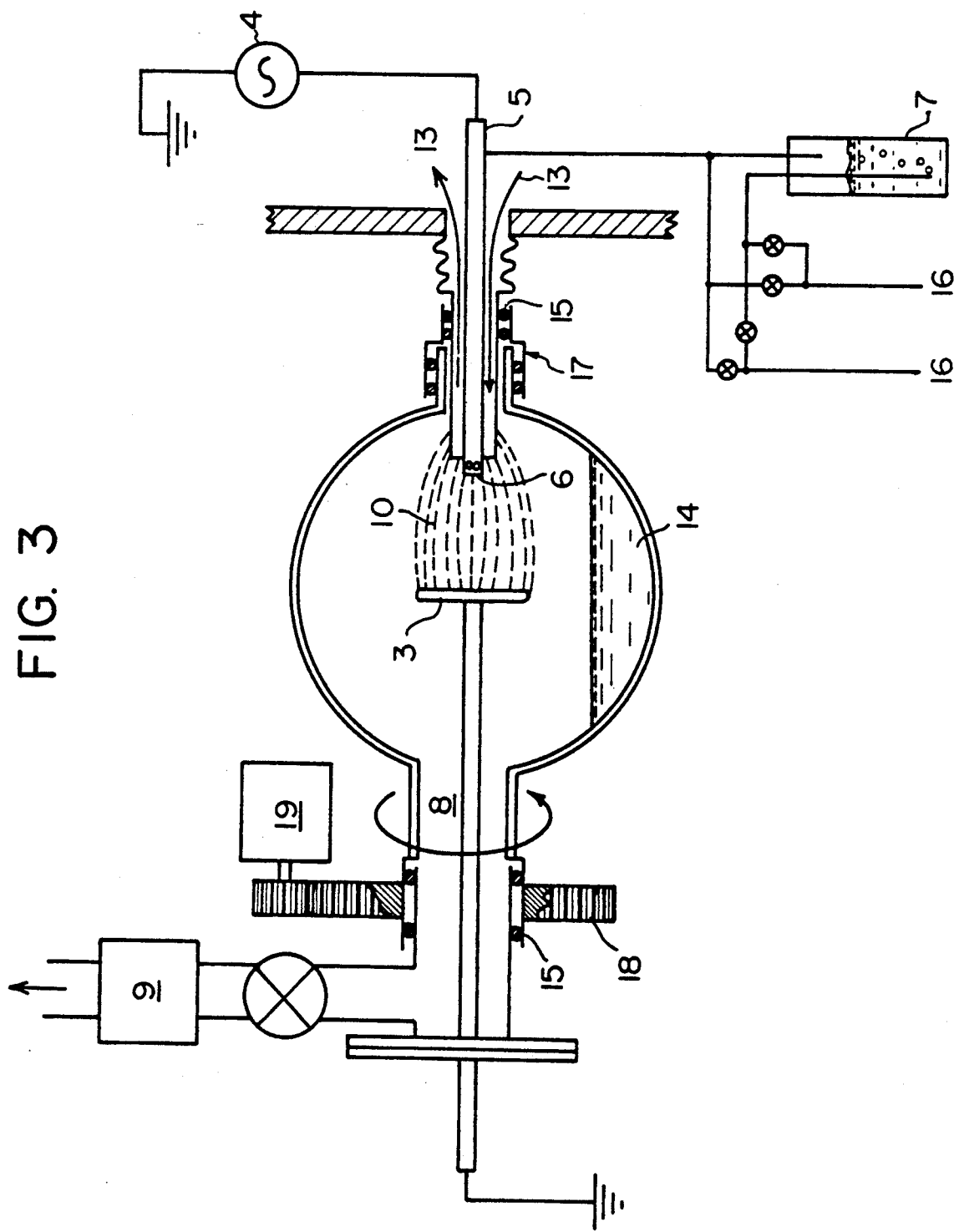
FIG. 3 is a sectional view of a particularly preferred embodiment of the capacitance-coupling plasma CVD apparatus of this invention.

FIGS. 1, 2 and 3 show reaction vessels in which the rotationally symmetrical shape of the inside wall with a curved surface is spherical. It may alternatively be another rotationally symmetrical shape such as an oblate, cylindrical or conical shape.

When a liquid medium is placed in the reaction vessel and the vessel is rotated, the liquid medium spreads on the inside wall and fine particles can be caused to adhere to the surface of the liquid medium. It is very easy therefore to produce magnetic fluids containing fine particles of iron, iron oxide or iron nitride, or colloids of metals or ceramics.

When an induction coil is provided on the peripheral portion of the reaction vessel as in FIG. 2 to produce a plasma within the reaction vessel instead of providing opposing electrodes within the reaction vessel, its function and effect are the same as in the case of using the electrodes.

According to the plasma vapor-phase reaction apparatus in accordance with this invention, the starting gas blowing port can be maintained at room temperature and the potential of the plasma can be stabilized without disturbance. This characteristic feature of the invention brings about the following excellent advantages over the prior art.

(1) Thermally unstable organometallic compound gases or inorganic metallic compound gases which cannot be used as starting gases in conventional plasma CVD apparatuses can be used in the present invention. Such thermally unstable starting gases include, for example, iron carbonyl [Fe(CO)$_5$], cobalt carbonyl [Co$_2$(CO)$_8$], nickel carbonyl [Ni(CO)$_4$], nickelocene ($\mu^5$—C$_2$H$_5$)$_2$Ni, Al(CH$_3$)$_3$, Al(C$_2$H$_5$)$_3$, Ga(CH$_3$)$_3$, Ga(C$_2$H$_5$)$_3$, In(CH$_3$)$_3$, In(C$_2$H$_5$)$_3$, B$_2$H$_6$, PH$_3$, AsH$_3$, BCl$_3$, BBr$_3$, BI$_3$, TiCl$_4$, GaCl$_3$, InCl$_3$, SiH$_3$, SiCl$_4$, GeH$_3$ and GeCl$_4$.

(2) By using the aforesaid starting gases with varying types of ambient gases such as Ar gas, H$_2$ gas, N$_2$ gas and NH$_3$ gas, fine particles of nitrides, for example, of these metals or fine particles of these metal elements can be obtained easily and at high yields.

(3) Since the starting gas blowing port can be maintained at room temperature, there is no blockage of the blowing port and the introducing pipe for the starting gas by thermally precipitated substances. The apparatus can therefore be operated continuously over a long period of time.

(4) In the capacitance-coupling plasma CVD apparatus, the cooling means is electrically insulated from the ground, the electric potential of the plasma is not disturbed, and the resulting reaction product has a homogeneous composition. The apparatus lends itself to easy operation, and the working efficiency is high.

In the plasma vapor-phase reaction apparatus of this invention, the plasma reaction vessel has a rotationally symmetrical inside wall with a curved surface, and is adapted to rotate around its axis of symmetry. This feature brings about the following excellent advantages over conventional apparatuses.

(5) The temperature in the reaction vessel becomes uniform, and fine particles having a homogeneous composition and a uniform particle diameter can be easily obtained.

(6) Since fine particles are accumulated in a uniform thickness onto the inner wall of the reaction vessel, they can be easily collected. The ratio of collection is about 10 times as high as that in a conventional fixed box-like apparatus.

(7) When in the production of magnetic fluids or colloidal fine particles, a liquid medium is put in the reaction vessel and the reaction vessel is rotated, the liquid medium spreads as a film on the inner wall and the fine particles can be collected by using the liquid film. Hence, the apparatus does not require a container for holding the liquid medium and a device for taking the fine particles into the liquid, and can be simplified as compared with the conventional apparatuses.

The apparatus shown in FIG. 1 is a plasma CVD apparatus having excellent operability, but still has problems to be solved.

In the laterally rotating type plasma CVD apparatus shown, for example, in FIG. 1, the opening 8, together with an exhaust system including the vacuum pump 9, is used as an insertion portion for the high-frequency electrode 5 which concurrently serves as the gas introduction pipe. Hence, a wide space under reduced pressure exists around the high-frequency electrode 5. As a result, the generation of a discharge cannot be avoided even in a pressure-reduced space which does not participate in the reaction of forming fine particles.

For this reason, the power is consumed for discharging in the space which does not participates in the reaction of forming fine particles. This entails instability in the state of plasma discharging in the zone in which the reaction of forming fine particles is taking place, and the properties of the reaction product become non-uniform.

Furthermore, owing to this phenomenon, the plasma CVD reaction cannot be continued for a long period of time, and the operation of the apparatus is troublesome. Another problem is that because of the occurrence of discharging in an area outside of the reaction zone of forming fine particles, the electrode material will be markedly consumed.

In an especially preferred embodiment of this invention shown in FIG. 3, an exhaust port means 8 for pressure reduction and a starting gas emitting port means 6 are provided at both ends of a reaction vessel 1 in spaced opposed relation to each other on a rotating axis of the vessel 1. A vacuum pump 9 is connected to the pressure reduction exhaust port means 8, and a grounded electrode 3 is inserted into the reaction vessel from the exhaust port 8.

A high-frequency electrode 5 which concurrently acts as a starting gas emitting pipe is inserted into the vessel 1 from the reaction zone side. A plurality of starting gas emitting port means 6 are formed in one end of the high-frequency electrode 5.

The grounded electrode 3 and the high-frequency electrode 5 acting concurrently as the starting gas emitting pipe are positioned opposite to each other.

As shown in FIG. 3, the surface of the grounded electrode 3 is larger than that of the high-frequency electrode 5, and because of this, the plasma CVD reaction becomes more stable and efficient.

The high-frequency electrode 5 acting also as the starting gas emitting pipe may be constructed in various shapes. For example, it may be a coil-like electrode having a plurality of gas emitting ports, or a flat plate-like high-frequency electrode having a plurality of gas emitting ports at its tip.

When the high-frequency electrode is not used concurrently as the starting gas emitting pipe, it is possible to provide an RF induction coil in the periphery of the reaction vessel 1 and thereby to generate a plasma discharge. The RF induction coil may instead be provided inside the reaction vessel 1.

Since the especially preferred embodiment of this invention as shown in FIG. 3 includes no unnecessary space outside of the reaction zone for forming fine particles, there is only a limited area in which a plasma is generated owing to discharging, and a high-frequency power can be effectively used in the vapor-phase reaction. Furthermore, because discharging outside the reaction zone of forming fine particles can be prevented, the state of the plasma can be maintained highly stable even when the apparatus is operated over a long period of time.

The following Examples illustrate the present invention more specifically.

EXAMPLE 1

A plasma CVD apparatus of the type shown in FIG. 1 was used (the reaction vessel had a capacity of 2,000 ml, and was not rotated).

A copper pipe 11 having an outside diameter of 3 mm was helically wound in contact around the starting gas blowing pipe which concurrently acted as an electrode. Air 13 (at room temperature, 5 atms.) was passed by an air compressor through a nylon insulating pipe to cool the starting gas blowing port means 6.

When the apparatus was operated under the following conditions, the blowing port means attained a temperature of 250° C. when no cooling was done, but attained a temperature of 30° C. or below when it was cooled.

While a vapor of $Fe(CO)_5$ as a starting gas was introduced into the reaction vessel together with $N_2$ gas (80 cc/min.) and Ar gas (120 cc/min.), the inside of the vessel was evacuated by a vacuum pump. While the pressure in the reaction vessel was maintained at about 1 mmHg, a high frequency of 13.56 MHz was applied to the electrodes to generate a plasma. The high-frequency power was about 80W, and the reaction time was one hour.

As a result, fine particles of $Fe_4N$ were produced at a rate of 2 g/hour. The reaction product adhered uniformly to the inside surface of the reaction vessel.

When the rate of feeding the $N_2$ gas and the Ar gas were changed respectively to 120 cc/min. and 80 cc/min., fine particles of $Fe_3N$ were obtained.

In contrast, when the starting gas blowing port means was not cooled, it was impossible to produce $Fe_3N$, $Fe_4N$ and Fe selectively according to the mixing ratio of the $N_2$ gas and the Ar gas as in the case of cooling the gas blowing port means by controlling the mixing ratio of $N_2$ and Ar gases, and only a mixture of $Fe_3N$ and Fe was always obtained. The amount of the product was as small as 0.2 g/hour. Furthermore, fine particles of Fe sedimented on the starting gas blowing port means to block it and prevented continuous operation.

EXAMPLE 2

Using the apparatus shown in FIG. 1, fine $Fe_3N$ particles were produced under the following conditions. The amount of the fine particles obtained was 1g, and they had an average particle diameter of about 100 Å.
Capacity of the reaction vessel: 2,000 ml
Starting gas: $Fe(CO)_5$ (evaporated at room temperature)
Ambient gas: $N_2$ (800 cc/min.), Ar (120 cc/min.)
Pressure in the reaction vessel: 1 mmHg
High frequency: 13.56 MHz, 100W
Rotating speed: 10 rpm
Reaction time: 30 hours.

EXAMPLE 3

As a liquid medium, 50 cc of a 5% alkylnaphthalene solution of polybutenylsuccinic acid polyamine was put in the reaction vessel, and while the reaction vessel was rotated at a rate of 10 rpm, the reaction was carried out under the conditions shown in Example 2. There was obtained 50 cc of a magnetic fluid containing $Fe_3N$ particles and having a saturation magnetization of about 200 gauss. The resulting fine particles had an average particle diameter of about 100 Å.

EXAMPLE 4

Example 2 was repeated except that $O_2$ gas was fed at a rate of 50 cc instead of $N_2$ gas. Fine particles of iron oxide having an average particle diameter of 100 Å were obtained.

EXAMPLE 5

Example 3 was repeated except that $O_2$ gas was fed at a rate of 50 cc instead of $N_2$ gas. A magnetic fluid containing fine particles of iron oxide having an average particle diameter of 150 Å were obtained.

EXAMPLE 6

Example 2 was repeated except that 60 cc/min. of $N_2$ gas and 140 cc/min. of Ar gas were fed. Fine particles of $Fe_4N$ having an average particle diameter of 150 Å were obtained.

EXAMPLE 7

This example illustrates the production of a magnetic fluid by using the plasma CVD apparatus shown in FIG. 3.

The operating conditions used were as follows:

| Reaction gas: | $Fe(CO)_5$ | 3 cc/min. |
|---|---|---|
| | Ar | 100 cc/min. |
| | $N_2$ | 20 cc/min. |

Pressure in the reaction vessel: 1 mbar
High frequency: 13.56 MHz, 100W
Rotating speed: 10 revolutions/min.
Liquid medium: 10% alkylnaphthalene solution of polybutenyl succinic acid polyamine (100 cc)
Reaction time: 20 hours As a result of this reaction, 100 cc of a magnetic fluid containing 20 g of $Fe_3N$ fine particles was obtained. The saturation magnetization of this magnetic fluid was 220 gauss. The state of discharging during the reaction was stable, and it was not at all necessary to adjust the state of discharging.

For comparison, a magnetic fluid was produced under the same conditons as above by using the apparatus shown in FIGS. 1 and 2. Plasma discharging stopped once for each about 30 minutes to 1 hour, and the operation could not be continued for a long period of time.

We claim:
1. A plasma CVD apparatus comprising: a rotatable plasma reaction vessel; a starting gas introducing pipe for introducing a starting gas thereinto;
   an ambient gas introducing pipe opening into said reaction vessel for introducing an ambient gas thereinto;
   an exhaust pipe opening out of said reaction vessel;
   means for applying a high frequency electric field to the interior of said reaction vessel;
   a starting gas blowing port means on said starting gas introducing pipe within said reaction vessel; and
   a cooling means in direct heat exchange relation with said port means for cooling said port means wherein said starting gas introducing pipe and said exhaust pipe are located in opposition to each other on a rotating axis of said reaction vessel.
2. An apparatus as claimed in claim 1 in which said starting gas introducing pipe and said ambient gas introducing pipe are a single pipe.
3. An apparatus as claimed in claim 1 wherein said port means comprises a portion of said starting gas introducing pipe within said reaction vessel and having gas ports therein, and said cooling means comprises a helical pipe of heat conducting material around said portion of said starting gas introducing pipe, and means for passing a cooling fluid therethrough.
4. An apparatus as claimed in claim 3 wherein said means for passing a cooling fluid comprises means for passing an insulating gas or liquid through sid helical cooling pipe.

5. An apparatus as claimed in claim 1 in which said means for applying a high frequency electric field comprises two electrodes in spaced opposed relation to each other, wherein one of the two electrodes is grounded.

6. An apparatus as claimed in claim 5 in which said cooling means is electrically insulated from ground.

7. An apparatus as claimed in claim 1 in which said means for applying a high frequency electric field comprises an induction coil around said reaction vessel.

8. An apparatus as claimed in claim 1 in which said reaction vessel is symmetrical about an axis of symmetry, and said apparatus further comprises means for rotating said reaction vessel around said axis of symmetry.

9. An apparatus as claimed in claim 8 in which said reaction vessel has an inside wall with a curved surface which is rotationally symmetrical about said axis of symmetry.

10. An apparatus as claimed in claim 9 in which said curved surface is spherical, oblate, cylindrical or conical.

11. An apparatus as claimed in claim 8 further comprising a base portion and said reaction vessel is detachably mounted on said base portion.

12. An apparatus as claimed in claim 1 in which said starting gas is at least one gas selected from gases of organo-metallic compounds and inorganic metallic compounds.

13. An apparatus as claimed in claim 1 in which the ambient gas is at least one gas selected from the group consisting of argon, hydrogen, nitrogen and ammonia.

14. A plasma CVD apparatus comprising a rotary vacuum reaction vessel, a starting gas introducing port means, an ambient gas introducing port means, an exhaust port means, electrodes or an induction coil for applying a high-frequency electric field, and a cooling means provided in said starting gas introducing port means for cooling said starting gas introducing port means, wherein said starting gas introducing port means and said exhaust port means are located in opposition to each other on a rotating axis of said reaction vessel.

15. The apparatus of claim 14 wherein a rotatable sealing means is provided in the exhaust port means and the starting gas introducing port means.

16. The apparatus of claim 14 wherein a grounded electrode is inserted in the exhaust port means, and an electrode for generating a low temperature plasma is inserted in the starting gas introduction port means.

17. The apparatus of claim 16 wherein a starting gas emitting port is formed in the low temperature plasma generating electrode.

18. The apparatus of claim 14 wherein a high-frequency induction coil is disposed in the interior, or on the periphery, of the reaction vessel.

19. The apparatus of claim 14 which is for the production of fine particles.

* * * * *